ELECTROLUMINESCENT SWITCHING CIRCUIT

Filed Oct. 3, 1960 3 Sheets-Sheet 1

INVENTOR.
EDWIN R BOWERMAN, JR.
BY R. J. Frank
ATTORNEY

Oct. 22, 1963 E. R. BOWERMAN, JR 3,108,189

ELECTROLUMINESCENT SWITCHING CIRCUIT

Filed Oct. 3, 1960 3 Sheets-Sheet 2

INVENTOR.
EDWIN R. BOWERMAN JR.
BY
R. J. Frank
ATTORNEY

Oct. 22, 1963 E. R. BOWERMAN, JR 3,108,189

ELECTROLUMINESCENT SWITCHING CIRCUIT

Filed Oct. 3, 1960 3 Sheets-Sheet 3

INVENTOR
EDWIN R. BOWERMAN JR.
BY R. J. Frank
ATTORNEY

United States Patent Office 3,108,189

Patented Oct. 22, 1963

3,108,189
ELECTROLUMINESCENT SWITCHING CIRCUIT

Edwin R. Bowerman, Jr., Whitestone, N.Y., assignor to General Telephone and Electronics Laboratories, Inc., a corporation of Delaware Filed Oct. 3, 1960, Ser. No. 60,046
5 Claims. (Cl. 250—209)

Figure 1:
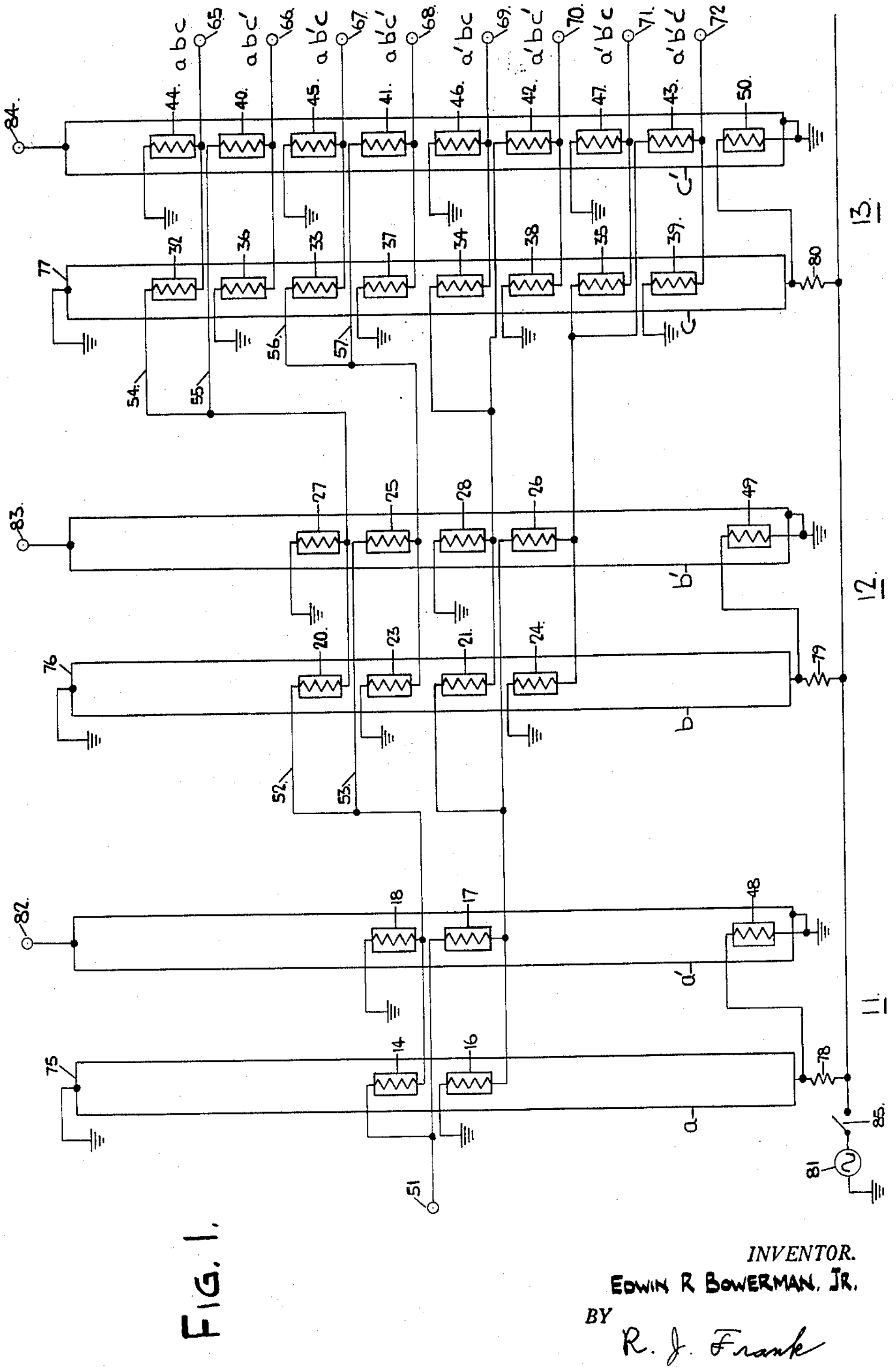

This invention relates to switching circuits and in particular to switching circuits utilizing electroluminescent and photoconductive components.

Switching circuits employing electroluminescent and photoconductive components are well suited for many computer applications. These applications include the decoding of binary input information and the conversion of binary to digital data for use in decimal readout devices. Accordingly, it is an object of my invention to provide an improved switching circuit utilizing light emitting and light responsive components such as electroluminescent cells and photoconductive elements.

Another object of this invention is to provide a switching circuit in which stray capacitances and other extraneous cross-coupling effects cannot produce incorrect voltages at the output terminals of the circuit.

Still another object is to provide a switching circuit requiring a minimum number of input control connections.

A further object is to provide a switching circuit which is compact, has no moving parts, and is inexpensive to fabricate.

In the present invention, a switching circuit comprising an array of successive switching stages is provided. Each of these stages includes first and second light emitting devices and each of the first and second light emitting devices has optically coupled thereto first and second groups of light responsive impedance elements.

In a preferred embodiment of the invention, each of the light responsive impedance elements consists of a photoconductor having a high impedance in the absence of light and a relatively low impedance when illuminated. In a typical photoconductor, the ratio of dark to light impedance may be as much as 1000 to 1. One end of the photoconductor is arbitrarily designated as the input end while the other end is referred to as the output end. The light emitting devices are preferably electroluminescent cells which produce light whenever a voltage of suitable magnitude and frequency is applied across their terminals.

The input ends of the first group of photoconductors included in the first switching stage are conductively connected to an input terminal while the output ends of these photoconductors are each conductively coupled to the input ends of at least one photoconductor of the first group in the following switching stage. Similarly, the photoconductors of the first group in each of the other switching stages are coupled between photoconductors of the first group in the adjacent stages. In the last switching stage, the output ends of each of the photoconductors of the first group are conductively coupled to a set of corresponding output terminals. By selectively energizing the electroluminescent cells in each stage and thereby allowing light to fall upon the photoconductors optically coupled thereto, the impedance between the input terminal and a selected output terminal may be decreased to a very low value while the impedance between the input terminal and each of the other output terminals remains high.

In each switching stage, the photoconductors of the second group are conductively coupled between the output ends of corresponding photoconductors of the first group and a common voltage reference point. A first set of this second group of photoconductors is optically coupled to the first electroluminescent cell. The photoconductors in this first set are conductively connected to the output ends of those photoconductors of the first group that are optically coupled to the second electroluminescent cell. The remainder of the photoconductors in the second group are optically coupled to the second electroluminescent cell. They are conductively connected to the output ends of the remaining photoconductors of the first group, these latter photoconductors of the first group being optically coupled to the first electroluminescent cell. Thus, the photoconductors of the second group are so connected that all of the output terminals except a selected one are normally held at a common reference potential thereby preventing capacitive coupling and other extraneous effects from producing incorrect output voltages.

One form of the invention utilizes a switching tree in which the first stage has two photoconductors optically coupled to each of the two electroluminescent cells, the second stage has four photoconductors optically coupled to each electroluminescent cell and the third stage has eight photoconductors optically coupled to each electroluminescent cell. In general, each electroluminescent cell is optically coupled to $2^n$ photoconductors, where $n$ is any integer greater than zero and corresponds to the position of a given stage in the array.

$2^{n-1}$ photoconductors are included in each of the first and second groups of photoconductors optically coupled to each electroluminescent cell. The output ends of each of the photoconductors in the first group of a given stage are conductively connected to the input ends of two photoconductors in the first group of the following stage, one of the photoconductors in the following stage being optically coupled to the first electroluminescent cell of that stage while the other photoconductor is optically coupled to the second electroluminescent cell of the following stage. The photoconductors of the second group in each stage are conductively coupled between the output ends of corresponding photoconductors of the first group and a common voltage reference point or ground. Whenever light impinges upon a photoconductor of the second group its impedance decreases thereby grounding the output of the photoconductor of the first group to which it is connected. Thus, as will be shown hereinafter, all of the output terminals except a selected one are effectively grounded by the second group of photoconductors.

When the switching tree configuration is used, the number of components in each additional stage is twice that emuloyed in the previous stage. Thus, if a large number of binary digits are to be switched, the space required for the latter stages becomes quite large when compared with the space required by the first few stages. However, a more uniform matrix of photoconductive elements may be obtained by using conventional techniques to fold the switching tree thereby distributing the photoconductors among the various switching stages.

In order to connect the input terminal to a selected one of the output terminals, one of the electroluminescent cells in each switching stage must be energized. This may be accomplished using only one control lead per switching stage by a circuit in which the first electroluminescent cell in each stage is normally energized through a resistor by a constant A.-C. voltage source. The second electroluminescent cell is optically coupled to a photoconductor (termed a transfer photoconductor) and conductively connected between ground and the junction of the resistor and the first electroluminescent cell. When the second electroluminescent cell is energized by an A.-C. control voltage, the impedance of the photoconductor is reduced thereby effectively shorting the first electroluminescent cell causing it to be extinguished.

Figure 2:
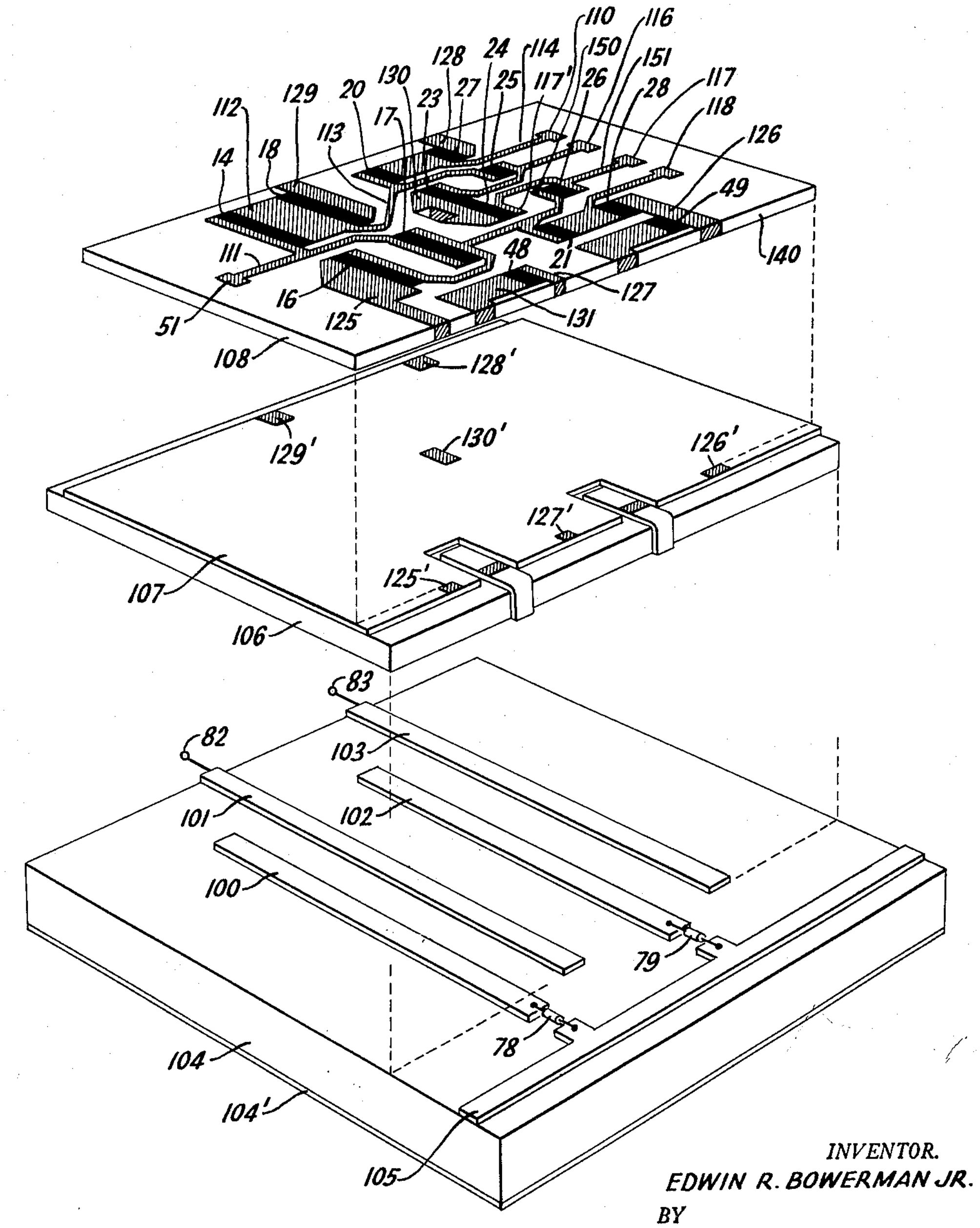
Figure 3A:
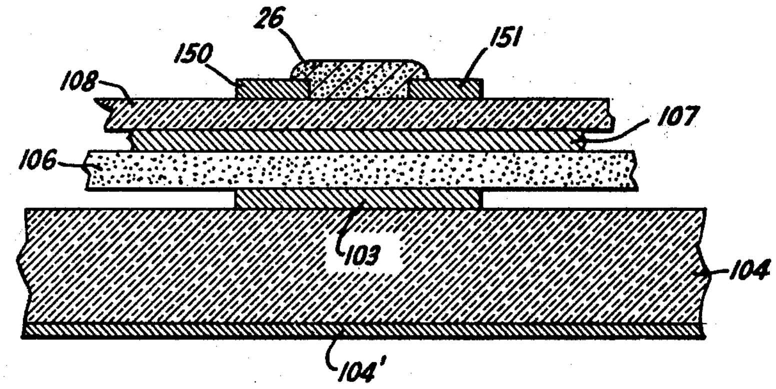
Figure 3B:
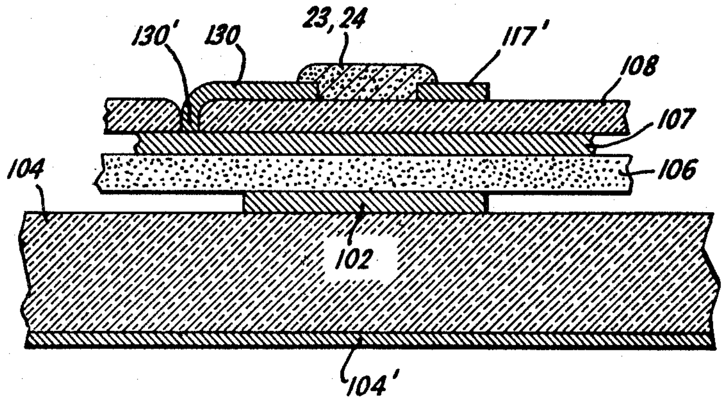

The above objects of and the brief introduction to the present invention will be more fully understood and further objects and advantages will become apparent from a study of the following description in connection with the drawings, wherein:

FIG. 1 is a schematic diagram of a switching circuit constructed in accordance with the principles of my invention, FIG. 2 is an exploded perspective view of two stages of a device built according to the schematic diagram of FIG. 1; and, FIGS. 3*a* and 3*b* are cross sectional views of selected parts of the device of FIG. 2.

Referring to FIG. 1, there is shown a schematic diagram of a switching circuit having three stages 11, 12, and 13. Each stage is provided with first and second electroluminescent cells, and each of these cells is optically coupled to first and second groups of photoconductive elements. In the first stage 11, photoconductor 14 constitutes the first group optically coupled to an electroluminescent cell *a*, while photoconductor 16 constitutes the second group coupled to cell *a*. Similarly, photoconductor 17 comprises the first group and photoconductor 18 the second group of photoconductors optically coupled to an electroluminescent cell *a'*. In the second stage 12, photoconductors 20, 21 are in the first group coupled to an electroluminescent cell *b* while photoconductors 23, 24 are in the second group coupled to this cell. Photoconductors 25, 26 and 27, 28 comprise the first and second groups of photoconductors respectively that are optically coupled to an electroluminescent cell *b'*. The third stage 13 has two electroluminescent cells *c* and *c'*. Photoconductors 32, 33, 34 and 35 are in the first group optically coupled to electroluminescent cell *c* while photoconductors 36, 37, 38, and 39 are in the second group optically coupled to cell *c*. The first group of photoconductors optically coupled to electroluminescent cell *c'* comprises photoconductors 40, 41, 42, and 43 while the second group consists of photoconductors 44, 45, 46, and 47. In addition, three transfer photoconductors 48, 49, and 50 are optically coupled to electroluminescent cells *a'*, *b'* and *c'*, respectively.

In general it will be noted that each group consists of $2^{n-1}$ photoconductors (exclusive of transfer photoconductors 48–50) wherein *n* is any integer exceeding zero and corresponds to the position of a given stage counting from the input terminal 51. One end of photoconductor 14 is connected to input terminal 51 while the other end is conductively connected by leads 52 and 53 to photoconductors 20 and 25 respectively in stage 12. Photoconductor 20 is in turn connected by leads 54 and 55 through photoconductors 32 and 40 to terminals 65 and 66. Photoconductor 25 is similarly connected by leads 56 and 57 through photoconductors 33 and 41 to terminals 67 and 68 respectively.

Photoconductor 17 has one end connected to input terminal 51 and the other end to photoconductors 21 and 26. Photoconductor 21, in turn, is connected through photoconductors 34 and 42 to output terminals 69 and 70 while photoconductor 26 is connected through photoconductors 35 and 43 to terminals 71 and 72.

The photoconductors of the second group optically coupled to electroluminescent cell *c'*, i.e. photoconductors 44–47, are connected between output terminals 65, 67, 69, and 71 respectively and ground, while the photoconductors of the second group 36–39 optically coupled to electroluminescent cell *c* are connected between terminals 66, 68, 70, and 72 respectively and ground. Similarly, photoconductors 23, 24, 27, and 28 are connected to the output ends of photoconductors 25, 26, 20 and 21 respectively, while photoconductors 16 and 18 are connected to the output ends of photoconductors 17 and 14 respectively.

Ends 75, 76, and 77 of electroluminescent cells *a*, *b*, and *c* are grounded while the other ends of these cells are connected through resistors 78, 79 and 80 respectively and switch 85 to an alternating voltage source 81. Terminals 82, 83, and 84 are connected to electroluminescent cells *a'*, *b'*, and *c'* for the application of A.-C. control pulses to the cells while the other ends of these cells are grounded. Photoconductors 48–50 are also grounded at one end while the other end of each of these photoconductors is connected to the junction of resistors 78–80 respectively and their associated electroluminescent cells.

When no alternating voltage is applied to the circuit, the impedances of all of the photoconductors are high and high impedance paths exist between the input terminal 51 and each of the output terminals 65–72. Closing switch 85 applies an alternating voltage across electroluminescent cells *a*, *b*, and *c* causing them to light. The light from cells *a*, *b*, and *c* falls on photoconductors 14, 16, 20, 21, 23, 24, 32, 33, 34, 35, 36, 37, 38, and 39 causing their impedances to be decreased to a relatively low value. As a result of the decrease in the impedances of photoconductors 14, 20 and 32 a low impedance path exists between input terminal 51 and output terminal 65. High impedance paths exist between input terminal 51 and the other output terminals 66–72 since these paths include photoconductors optically coupled to unenergized electroluminescent cells *a'*, *b'* and *c'*. It shall be noted that the letters *abc* are located adjacent terminal 65 in FIG. 1 to indicate that this, and only this terminal is connected by a low impedance path to input terminal 51 when electroluminescent cells *a*, *b*, and *c* are energized.

Since the impedances of the dark photoconductors is very high the voltage at output terminals 66–72 should be substantially zero when only electroluminescent cells *a*, *b*, and *c* are illuminated. However, capacitive coupling between the photoconductors in a practical configuration tends to produce extraneous output voltages at those terminals unless provisions are made for effectively grounding them. Thus, when electroluminescent cells *a*, *b*, and *c* are energized, terminal 66 is effectively grounded through photoconductor 36, the impedance of photoconductor 36 being low because it is receiving light from electroluminescent cell *c*. Similarly, terminal 67 is grounded through illuminated photoconductors 33 and 23. Terminal 68 is grounded through photoconductor 37, terminal 69 through photoconductors 34, 21 and 16, terminal 70 through photoconductor 38, terminal 71 through photoconductors 35 and 24, and terminal 72 through photoconductor 39. Terminal 65 is, of course, not grounded since none of the grounded photoconductors (18, 27, and 44) along the path between input terminal 51 and terminal 65 are illuminated.

If now, a control voltage is arbitrarily assumed to be applied to terminal 83, electroluminescent cell *b'* will light. Light from cell *b'* strikes photoconductors 25–28 and transfer photoconductor 49 causing their impedances to drop to a very low value. Since transfer photoconductor 49 is grounded at one end, a ground is effectively applied between resistor 79 and electroluminescent cell *b* thereby extinguishing cell *b* and causing the impedance of photoconductors 20, 21, 23, and 24 to increase. During the switching operation, input terminal 51 is momentarily grounded through photoconductors 20 and 23. However, if this is undesirable in a particular application, provision may be made for opening the lead to terminal 51 while switching is taking place.

With electroluminescent cells *a*, *b'* and *c* energized, a low impedance path exists through photoconductors 14, 25, and 33 to terminal 67. Terminals 65, 66 and 68–72 are all grounded as shown in FIG. 1. In the same manner each of the other output terminals may be energized by selectively exciting the proper electroluminescent cells. The particular combination of cells which must be illuminated to energize a particular output terminal is indicated by the letters adjacent each terminal.

Referring to FIG. 2, there is shown an exploded perspective view of a device constructed in accordance with the schematic diagram of FIG. 1. For simplicity, only two stages have been shown although it is evident that any number of stages may be added to the circuit. Also, the same numerals have been used in FIGS. 1 and 2 to identify corresponding photoconductors and resistors.

As depicted in FIG. 2, four electrodes 100, 101, 102, and 103 are applied to a sandblasted glass base 104 having a coating of black paint 104' on the side opposite the electrodes. Electrodes 100 and 102 are each coupled to a conductive bus 105 through resistors 78 and 79 while electrodes 101 and 103 are connected to terminals 82 and 83 respectively. Electrodes 100–103 and bus 105 may be formed of gold or may consist of transparent conductors.

An electroluminescent layer 106 is applied over electrodes 100–103 and a grounded transparent conductive layer 107 is affixed to electroluminescent layer 106. A sheet of clear glass 108 is placed over transparent conductor 107 and strips of photoconductive material applied thereto. Electrical connections are made to the photoconductors by gold conductors, such as 111, 112, 150 and 151 which are bonded to the glass. Ground connections are made to conductors 125–129 by extending the conductor over the edge of glass 108 to make contact with transparent conductive layer 107 at 125'–129' respectively. Transfer photoconductor 48 is connected to resistor 78 by conductor 131 which is joined to electrode 100 through a slot in conductive layer 107. In a similar manner transfer photoconductor 49 is electrically connected to resistor 79.

Details of the construction of the device are further shown in the cross-sectional views of FIGS. 3*a* and 3*b*. FIG. 3*a* is a cross-section taken across photoconductor 26 parallel to the front edge 140 of the glass 108, while FIG. 3*b* is a cross sectional view taken through photoconductor 24, conductor 117' and the opening in conductor 130.

When bus 105 is connected to alternating voltage source 81 (FIG. 1) and transparent conductor 107 is grounded, an electric field is applied across electroluminescent layer 106 causing it to emit light in the areas adjacent conductors 100 and 102. This light falls only on photoconductors 14, 16, 20, 21, 23, and 24 and causes their impedance to decrease sharply in the manner previously described. Thus, a low impedance path is created between terminal 51 and terminal 110 consisting of conductor 111, photoconductor 14, conductors 112 and 113, photoconductor 20 and conductor 114. Also terminal 116 is grounded through photoconductor 23, terminal 117 through photoconductor 24, and terminal 118 through photoconductors 21 and 16. As explained in connection with FIG. 1 any one of the terminals 116–118 may be energized and the remaining terminals grounded by applying control signals to terminals 82 and 83.

An important feature of this invention is that an output voltage is produced only at a selected output terminal despite capacitive coupling between the circuit components. This is accomplished by illuminating photoconductors connected between each of the other output terminals and ground. Also, when an alternating voltage is applied to the photoconductors, additional shielding is provided by the grounding of transparent conductive layer 107. If electroluminescent lamps having an area of about 0.5 square inch are connected as loads to the output terminals of the switching circuit, the photoconductors may have an impedance when illuminated of about 200,000 ohms. For other applications, photoconductors having lower impedances in the light may be found desirable.

As many changes could be made in the above construction and many different embodiments could be made without departing from the scope thereof, it is intended that all matter contained in the above description or shown in the accompanying drawings shall be interpreted as illustrative and not in a limiting sense.

What is claimed is:

1. A switching circuit comprising an array of successive switching stages, each of said stages including first and second electroluminescent cells; first and second groups of photoconductive elements optically coupled to each of said electroluminescent cells; means conductively connecting each of the photoconductive elements in said first group to at least one photoconductive element in the first group of an adjacent stage; means conductively connecting one end of each of the photoconductive elements in the second group that is optically coupled to the first electroluminescent cell to a corresponding photoconductive element of the first group, said corresponding photoconductive element of the first group being optically coupled to the second electroluminescent cell; and means conductively connecting one end of each of the photoconductive elements in the second group that is optically coupled to the second electroluminescent cell to a corresponding photoconductive element of the first group, said corresponding photoconductive element of the first group being optically coupled to the first electroluminescent cell; the other ends of the photoconductive elements in said second group being connected to a common voltage reference point, each of the photoconductive elements in said second group connecting the photoconductive element in said first group to said voltage reference point whenever the electroluminescent lamp associated with the photoconductive element in said second group is energized.

2. A switching circuit comprising an array of successive switching stages, each of said stages including first and second electroluminescent cells; first and second groups of photoconductive elements optically coupled to each of said electroluminescent cells; an input terminal; means connecting said input terminal to one end of each of the first group of photoconductor elements located in the first stage of said array; a plurality of output terminals, each of said output terminals being conductively connected to one end of a photoconductive element of the first group located in the last stage of said array; means connecting the other ends of the photoconductive elements of the first group located in said first and last stages of said array in series with at least one photoconductive element of the first group from each of the intermediate stages; means conductively connecting one end of each of the photoconductive elements of the second group that is optically coupled to the first electroluminescent cell to the other ends of a corresponding photoconductive element of the first group that is optically coupled to the second electroluminescent cell; and means conductively connecting one end of each of the photoconductive elements of the second group that is optically coupled to the second electroluminescent cell to the other ends of a corresponding photoconductive element of the group that is optically coupled to the first electroluminescent cell, the other ends of said second group of photoconductive elements being connected to a common voltage reference point, said second group of photoconductive elements connecting all but a selected one of said output terminals to said voltage reference point.

3. A switching circuit comprising an array of successive switching stages, each of said stages including first and second electroluminescent cells and first, second, third and fourth groups of photoconductive elements; said first and second groups of photoconductive elements being optically coupled to the first electroluminescent cell in each stage and said third and fourth groups of photoconductive elements being optically coupled to the second electroluminescent cell in each stage, each of said groups including $2^{n-1}$ photoconductive elements where $n$ is any integer greater than zero corresponding to the position of a given stage in said array; means conductively connecting one terminal of each of the photoconductive elements in said first group to one terminal of a corresponding photoconductive element in said third group; means conductively connecting each of the photoconductive elements in said second group between the other terminal of a corresponding photoconductive element in said third group and a common voltage reference point; means conductively connecting each of the photoconductive elements in said fourth group between the other terminal of a corresponding photoconductive element in said first group and said common voltage reference point; means conductively connecting the junctions of the photoconductive elements in said first and third groups to the preceding stage, one-half of said junctions being connected to corresponding junctions of the photoconductive elements in the first and fourth groups of said preceding stage and the other half being connected to corresponding junctions of the photoconductive elements in the second and third groups of said preceding stage; means conductively connecting one-half of the junction of the photoconductive elements in said first and fourth groups to corresponding junctions of the photoconductive elements of the first and third groups of the following stage; and means conductively connecting the remaining half of the junction of the photoconductive elements in said second and third groups to corresponding junctions of the photoconductive elements in the first and third groups of the following stage.

4. A switching circuit comprising a non-conductive base; first and second spaced electrodes affixed to said base; an electroluminescent layer; a transparent conductive layer, said electroluminescent layer being positioned between said electrodes and said transparent conductive layer; a transparent insulating layer attached to said transparent conductive layer; first, second, third and fourth photoconductive elements affixed to said transparent insulating layer, said first and second photoconductive elements being illuminated when a voltage is applied between said first electrode and said transparent conductive layer, and said third and fourth photoconductive elements being illuminated when a voltage is applied between said second electrode and said transparent conductive layer; an input terminal; and conductive bars affixed to said transparent insulating layer, said conductive bars connecting said first and third photoconductors to said input terminal, and said second and fourth photoconductors to said first and third photoconductors respectively, said second and fourth photoconductors being further connected by said conductive bars to said transparent conductive layer.

5. A switching circuit as defined by claim 4 wherein said circuit further comprises a fifth photoconductor affixed to said transparent insulating layer, said fifth photoconductor being illuminated when a voltage is applied between said second electrode and said transparent conductive layer, said fifth photoconductor being further connected by said conductive bars to said first electrode.

References Cited in the file of this patent

UNITED STATES PATENTS

| | | |
|---|---|---|
| 2,885,564 | Marshall | May 5, 1959 |
| 2,985,763 | Ness | May 23, 1961 |

OTHER REFERENCES

RCA Technical Notes (RCA TN No. 390), June 1960, pp. 1 to 3, "Triggerable Flip-Flop Circuit With Electroluminescent and Photoconductive Elements," Haining.